United States Patent
Fiebag et al.

(10) Patent No.: US 6,562,555 B2
(45) Date of Patent: May 13, 2003

(54) METHOD FOR DEVELOPING LITHOGRAPHIC PRINTING PLATE PRECURSORS USING A COATING ATTACK-SUPPRESSING AGENT

(75) Inventors: Ulrich Fiebag, Rosenweg (DE); Celin Savariar-Hauck, Badenahusen (DE); Gerhard Hauck, Badenahusen (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/919,695

(22) Filed: Aug. 1, 2001

(65) Prior Publication Data

US 2003/0031960 A1 Feb. 13, 2003

(51) Int. Cl.$^7$ ................................. G03F 7/30
(52) U.S. Cl. ....................... 430/399; 430/302
(58) Field of Search ................. 430/399, 302

(56) References Cited

U.S. PATENT DOCUMENTS

| | | | | |
|---|---|---|---|---|
| 4,259,434 A | | 3/1981 | Yamasue et al. | 430/302 |
| 4,452,880 A | | 6/1984 | Seino et al. | 430/309 |
| 5,217,848 A | * | 6/1993 | Uehara et al. | 101/463.1 |
| 5,635,328 A | * | 6/1997 | Higashino et al. | 430/165 |
| 5,837,425 A | * | 11/1998 | Nakanishi et al. | 430/302 |
| 5,851,735 A | | 12/1998 | Miller et al. | 430/322 |
| 5,998,102 A | | 12/1999 | Eckler | 430/325 |
| 6,143,479 A | | 11/2000 | Fiebag et al. | 430/331 |
| 6,255,042 B1 | | 7/2001 | Fiebag et al. | 430/331 |
| 6,364,544 B1 | * | 4/2002 | Sasayama et al. | 396/578 |
| 6,391,530 B1 | * | 5/2002 | Timpe et al. | 430/450 |
| 6,423,458 B2 | * | 7/2002 | Ohnishi | 430/30 |
| 2001/0037742 A1 | | 11/2001 | Ohnishi | 101/451 |

FOREIGN PATENT DOCUMENTS

| | | |
|---|---|---|
| EP | 0 274 044 | 7/1988 |
| EP | 0405986 | 1/1991 |
| EP | 0 732 628 | 9/1996 |
| EP | 1081554 | 3/2001 |
| EP | 1103859 | 5/2001 |
| EP | 1156371 | 11/2001 |
| GB | 2276729 | 10/1994 |
| JP | 3038647 | 2/1991 |

* cited by examiner

*Primary Examiner*—Hoa Van Le
(74) *Attorney, Agent, or Firm*—RatnerPrestia

(57) ABSTRACT

A method for developing exposed lithographic printing plate precursors using a developer and replenisher is disclosed. The replenisher contains a higher concentration of a coating attack-suppressing agent than the developer, so that the aggressiveness of the developer remains substantially constant during the developer loading cycle.

28 Claims, No Drawings

METHOD FOR DEVELOPING LITHOGRAPHIC PRINTING PLATE PRECURSORS USING A COATING ATTACK-SUPPRESSING AGENT

FIELD OF THE INVENTION

This invention relates to a method for developing exposed lithographic printing plate precursors using a developer and replenisher. In particular, this invention relates to a method in which the replenisher comprises a higher concentration of a coating attack-suppressing agent than the developer.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plates, also called printing plate precursors, typically comprise an imageable layer applied over the surface of a hydrophilic substrate. The imageable layer includes one or more radiation-sensitive components, which may be dispersed in a suitable binder. Alternatively, the radiation-sensitive component can also be the binder material.

To obtain a printing plate with imagewise distribution of printable regions, it is necessary to remove regions of an imaged precursor. The most common method for removing the undesired regions is to contact the imaged precursor with a developer. If after exposure to radiation the exposed regions of the imageable layer are removed by the developer revealing the underlying hydrophilic surface of the substrate, the precursor is a positive-working printing plate. Conversely, if the unexposed regions are removed, the precursor is negative-working. In each instance, the regions of the imageable layer (i.e., the image areas) that remain after development are ink-receptive, and the regions of the hydrophilic surface revealed by the developing process accept water and aqueous solutions, typically a fountain solution, and repel ink.

Most positive-working and negative-working printing plate precursors comprise materials that are soluble or dispersible in aqueous base, such as phenolic polymers, carboxylic acid polymers, and/or sulfonamide polymers, in the imageable layer. Consequently, alkaline solutions are useful as developers.

The development process is typically carried out in a processor equipped with an immersion type-developing bath, a section for rinsing with water, a gumming section, and a drying section. During the development process, some of the developer is removed from the developing bath with the developed printing plates (drag-out). In addition, some of the base in the developer is consumed as the developer becomes loaded with components of the imageable layer that have been removed during the development process.

To achieve constant activity for the developer, the activity of the developer is monitored, and a replenisher is periodically added to the developer bath so that a balance between developer drag-out and developer feed-in is reached. The replenisher differs from the developer in that it has a higher concentration of the alkaline component or components present in the developer to compensate for the base consumed in the development process.

Batches of developer are typically used for periods of several days to several weeks before they are replaced with fresh developer. Although the conductivity of the developer is maintained at its original value during the developer loading cycle, the developer becomes more aggressive during this period. That is, for precursors that have been exposed with equivalent amounts of radiation, the developer removes more of the imageable layer during the later stages of the developer loading cycle than during the early stages of the developer loading cycle. Thus, a need exists for a method for developing exposed lithographic printing plate precursors using a developer and replenisher in which the developer does not become more aggressive during the later stages of the developer loading cycle.

SUMMARY OF THE INVENTION

The invention is a method for developing an exposed lithographic printing plate precursor using a developer and replenisher in which the developer does not become more aggressive during the later stages of the developer loading cycle. The method comprises the steps of:

developing the exposed printing plate precursor with the developer; and
adding the replenisher to the developer so that the activity of the developer remains relatively constant;
wherein:
  the printing plate precursor comprises an imageable layer:
    the imageable layer comprises a material that is soluble or dispersible in aqueous alkaline solution;
    the developer comprises an alkaline material and a developer-soluble coating attack-suppressing agent;
    the replenisher comprises the alkaline material and the coating attack-suppressing agent;
    the alkaline material in the replenisher is at a higher concentration than the alkaline material in the developer; and
    the coating attack-suppressing agent in the replenisher is at a higher concentration than the coating attack-suppressing agent in the developer.

Typically, the coating attack-suppressing agent is a developer-soluble polyethyoxylated, polypropoxylated, and/or polybutyloxylated compound. Preferably, the coating attack-suppressing agent is a developer-soluble compound selected from the group consisting of:

(1) compounds of the structure:

in which n is an integer; $R^1$ is hydrogen, $C_1$–$C_{18}$ alkyl, $C_1$–$C_{18}$ aryl, $C_1$–$C_{18}$ substituted aryl, or $C_1$–$C_{18}$ aralkyl; $R^2$ is hydrogen, methyl, or ethyl; $R^3$ is hydrogen, $C_1$–$C_8$ alkyl, —$CH_2COOH$, or $CH_2COO^-$ $M^+$, in which M is ammonium, substituted ammonium, sodium or potassium; and (2) polycondensation products of at least one $C_2$–$C_4$ alkylene oxide and ethylene diamine.

DETAILED DESCRIPTION OF THE INVENTION

Coating Attack-Suppressing Agent

The coating attack-suppressing agent is a developer-soluble compound that suppresses attack on the coating by the developer. "Developer-soluble" means that enough of the agent will dissolve in the developer to suppress attack on the coating by the developer. Throughout the specification and claims, unless the context indicates otherwise, "coating attack-suppressing agent" includes mixtures of such agents.

Typically the coating attack-suppressing agent is a developer-soluble polyethyoxylated, polypropoxylated, and/or polybutyloxylated compound. That is, a compound that comprises recurring units of the —$(CH_2$—$CHR^2$—$O)$— structural unit, in which each $R^2$ is independently hydrogen, methyl, or ethyl. Preferably, the coating attack-suppressing agent is an polyethyoxylated, polypropoxylated, or poly(ethoxylated/propoxylated) compound. That is, a compound that comprises recurring units of the —$(CH_2$—$CHR^2$—$O)$— structural unit, in which each $R^2$ is independently hydrogen or methyl. One group of preferred compounds are those that comprise at least one polyoxyethylene block and at least one polyoxypropylene block.

Preferably, the coating attack-suppressing agent is a developer-soluble compound selected from the group consisting of:

(1) polyglycols of the formula:

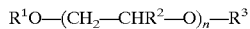

in which n is an integer; $R^1$ is hydrogen, $C_1$–$C_{18}$ alkyl, $C_1$–$C_{18}$ aryl, $C_1$–$C_{18}$ substituted aryl, or $C_1$–$C_{18}$ aralkyl; $R^2$ is hydrogen, methyl, or ethyl; $R^3$ is hydrogen, $C_1$–$C_8$ alkyl, —$CH_2COOH$, or $CH_2COO^-$ $M^+$, in which M is ammonium, substituted ammonium, sodium or potassium; and (2) polycondensation products of at least one $C_2$–$C_4$ alkylene oxide with ethylene diamine.

The value of n will depend on the nature of $R^1$, $R^2$, and $R^3$. If $R^1$ and/or $R^3$ are relatively large alkyl groups, n will typically be larger to provide the required developer solubility. However, n should not be so large that the coating attack-suppressing agent unacceptably increases the viscosity of the developer. Typically n will be between about 2 and about 160, more typically between about 3 and about 100, even more typically between about 4 and about 80.

All the $R^2$ groups need not be the same in a particular coating attack-suppressing agent. For example, block and random copolymers of ethylene oxide and propylene oxide are included in the definition of coating attack-suppressing agents. $R^2$ is preferably hydrogen and/or methyl.

Compounds of the structure $R^1O$—$(CH_2$—$CHR^2$—$)_n$—OH may be used as the coating attack-suppressing agent. In these materials, n is typically about 3 to about 50, preferably about 4 to about 20. $R^1$ may be a substituted or unsubstituted aromatic or aliphatic group. When $R^1$ is substituted or unsubstituted phenyl, it is typically phenyl substituted with an alkyl group comprising eight or nine, carbon atoms. When $R^1$ is a saturated aliphatic group, it typically contains 6 to 18 carbon atoms.

Numerous polyethoxylated and polypropoxylated compounds are available from various suppliers under various trade names and are described, for example, in *Industrial Chemical Thesaurus,* 2nd ed., Vol. 1 and 2, M. Ash and I. Ash, Editors, VCH Publishers, New York. The compounds and tradenames listed below are only examples of numerous compounds that are available or could be prepared. Mixtures of these compounds may also be used.

The polyethoxylated alkyl phenols, especially nonyl phenol (nonyloxynols) and octyl phenol (octoxynols) ethoxylated with varying amounts of ethylene oxide, are widely available. Examples include: octoxynol-4 (i.e., octylphenol ethoxylated with four moles of ethylene oxide); octoxynol-5 (TRITON® X-45, Union Carbide); octoxynol-6; octoxynol-7; octoxynol-8 (TRITON® X-1114, Union Carbide); octoxynol-9 (TRITON® X-100, Union Carbide; IGEPAL® CA-630, Rhone-Poulenc); octoxynol-10; octoxynol-11; octoxynol-12; octoxynol-13 (TRITON® X-102, Union Carbide; IGEPAL® CA-720, Rhone-Poulenc); octoxynol-20 (Synperonic OP20, ICI Americas); nonyloxynol-4 (TERGITOL® NP-4, Union Carbide); nonyloxynol-6 (TERGITOL® NP-6, Union Carbide); nonyloxynol-7; nonyloxynol-8; nonyloxynol-9 (TERGITOL® NP-9, Union Carbide); nonyloxynol-10 (TERGITOL® NP-10, Union Carbide; IGEPAL® CO-660, Rhone-Poulenc); nonyloxynol-15 (TERGITOL® N-15, Union Carbide); and nonyloxynol-20 (TERGITOL® N-20, Union Carbide). Ethoxylated derivatives of aliphatic alcohols include, for example, deceth-6 (TRYCOL® 5952, Henkel) (i.e., decanol ethoxylated with six moles of ethylene oxide); laureth-4 (BRIJ® 30, ICI); laureth-5; laureth-9; laureth-10 (Dehydrol 100 Henkel); laureth-20 (MARLOWET® LMA 20, Huls); ceteth-4; ceteth-10 (MACOL® CA-10, PPG); ceteth-12; ceteth-16; and ceteth-20 (DERMALCARE® C-20, Rhone-Poulenc). Compounds that contain polyethoxylated mixtures of aliphatic alcohols are also available.

Polypropoxylated derivatives of aliphatic alcohols available under the UCON® tradename (Union Carbide) include, for example, PPG-5 butyl ether (i.e., butyl alcohol reacted with 5 moles of propylene oxide) (UCON® LB-65); PPG-15 butyl ether (UCON® LB-285); PPG-22 butyl ether UCON® LB-525); PPG-40 (UCON® LB-1715); and PPG-53 (UCON® LB-3000).

Carboxylic acids of the following general structure and their water-soluble salts are commercially available:

In these compounds, $R^2$ is preferably hydrogen, and n is preferably 3 to 16. Examples include: capryleth-6 carboxylic acid (AKYPO® LF1, Chem-Y GmbH); capryleth-9 carboxylic acid (AKYPO® LF2, Chem-Y GmbH); laureth-4 carboxylic acid (AKYPO® RLM 25, Chem-Y GmbH); laureth-6 carboxylic acid; laureth-11 carboxylic acid (AKYPO® RLM 100, Chem-Y GmbH); and laureth-14 carboxylic acid (AKYPO® RLM130, Chem-Y GmbH). Water-soluble salts of these compounds are typically ammonium, substituted ammonium, or alkali metal salts, such as sodium or potassium; more typically sodium salts or ethanolamine salts of these compounds.

Polymers and copolymers of the general structure:

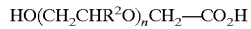

in which $R^2$ is hydrogen and/or methyl may be used as the coating attack-suppressing agent. An example is Polyglycol M41/40 (Hoechst).

Polyethylene oxides of varying molecular weight are commercially available, for example as POLYOX® water-soluble polymers (Amerchol, Edison, N.J., USA) and as RITA PEOs (R.I.T.A. Corp., Woodstock, Ill., USA). Examples include: POLYOX® WSR N-60K (MW about 2,000,000); POLYOX® WSR N-750 (MW about 600,000); RITA PEO-1 (MW about 210,000); RITA PEO-2 (MW about 400,000); RITA PEO-3 (MW about 1,000,000); RITA PEO-8 (MW about 1,900,000); RITA PEO-18 (MW about 4,400,000); RITA PEO-27 (MW about 7,200,000).

Polypropylene oxides of varying molecular weight are commercially available. For example PPG-12 (polymer containing 12 moles of propylene oxide) (PLURACOL® P-710, BASF); PPG-17 PLURACOL® P-710, BASF); PPG-20 (MACOL® P-1200, PPG); PPG-26 (MACOL® P-2000, PPG); and PPG-30; PPG-34.

Random copolymers of ethylene oxide and propylene oxide (PEG/PPG copolymers), with various molecular weights and with various ratios of ethylene oxide to propylene oxide are available, for example, under the UCON® tradename (Union Carbide). Examples are: UCON® 75-H-90000, a random copolymer of 125 moles of ethylene oxide and 30 moles of propylene oxide; UCON® 75-H-450, a random copolymer of 17 moles of ethylene oxide and 6 moles of propylene oxide; UCON® 75-H-490, a random copolymer of 18 moles of ethylene oxide and 4 moles of propylene oxide; UCON® 25-H-205, a random copolymer of 23 moles of ethylene oxide and 50 moles of propylene oxide; UCON® 75-H-1400, a random copolymer of 35 moles of ethylene oxide and 9 moles of propylene oxide.

Polyoxyethylene/polyoxypropylene/polyoxyethylene, A-B-A block copolymers of ethylene oxide and propylene oxide, which are referred to as poloxamers [CAS #9003-11-6], are a preferred group of coating attack-suppressing agents. Commercially available poloxamers include, for example, poloxamers 101, 105, 108, 122, 123, 124, 181, 182, 183, 184, 185, 188, 212, 215, 217, 231, 234, 235, 237, 238, 282, 284, 288, 313, 333, 334, 335, 338, 401, 402, 403, and 407. These compounds are available under the PLURONIC® (BASF), MACOL® (PPG/Specialty Chem,), and SYNPERONIC® PE (ICI, Uniqema) tradenames.

Polycondensation products of at least one $C_2$–$C_4$ alkylene oxide with ethylene diamine are another group of coating attack-suppressing agents, preferably polycondensation products of at least one $C_2$–$C_3$ alkylene oxide with ethylene diamine. A preferred group of these compound are the polyoxyethylene, polyoxypropylene block copolymers of ethylene diamine, which are known as poloxamines [CAS #11111-34-5]. Commercially available poloxamines include, for example, poloxamine 304, poloxamine 504, poloxamine 701, poloxamine 702, poloxamine 704, poloxamine 707, poloxamine 901, poloxamine 904, poloxamine 908, poloxamine 1101, poloxamine 1102, poloxamine 1104, poloxamine 1107, poloxamine 1301, poloxamine 1302, poloxamine 1304, poloxamine 1307, poloxamine 1501, poloxamine 1502, poloxamine 1504, and poloxamine 1508. Polyoxyethylene, polyoxypropylene block copolymers of ethylene diamine are commercially available under the SYNPERONIC® T (ICI, Uniqema) and TETRONIC® (BASF) tradenames.

In addition to these materials, cationic materials may be used as the coating-attack suppressing agent include quaternary ammonium chlorides, such as N-cetyl-N,N,N-trimethyl ammonium chloride; N-lauryl-N,N,N-trimethyl ammonium chloride; and cetyl pyridinium chloride. An alkyl group of 10 carbon atoms to 18 carbon atoms is typically present in these materials. Useful cationic materials also include quaternary ammonium salts of ethoxylated and propoxylated ethanolamines, for example, $[CH_3N(CH_2CH_3)_2(CH_2CHRO)_nH]^+$ Cl– (EMCOL® CC-9 and EMCOL® CC-36, Witco, which R is methyl and n is about 9 and about 25, respectively).

Water-soluble esters of the general structure may be used as coating attack-suppressing agents:

$$R^1CO-(OCH_2CHR^2)_nOH.$$

Examples include: PEG-6 laurate (KESSCO® PEG 300 ML, Stepan), PEG-8 laurate (MAPEG® 400 ML, PPG), PEG-8 stearate (Nopalcol 4-S Henkel), PEG-10 stearate (ETHOFAT® 60/20, Akzo), PEG-8 myristate, PEG-20 myristate, PEG-8 oleate (Nopalcol 4-O, Henkel), and PEG-12 oleate (Nopalcol 6-O, Henkel).

Other useful coating attack-suppressing agents include nonionic fluoro-surfactants such as FLUORAD® FC 430, and FLUORAD® FC 431, (3M) and copolymer acrylates with perfluoroalkyl and polyoxyalkyene groups (Megafac DG001 and Megafac F171, Dainippon Ink & Chemical). Polyethoxylated siloxanes, such as polyethoxylated dimethylsiloxanes (dimethicone copolymers) (DOW CORNING® 190 and 193, Dow Corning; and SILWET® L-720, L-7000, L-7500, and L-7600, Union Carbide); polyethoxylated polysiloxane copolymers, such as Byk 307, a polyethoxylated dimethylpolysiloxane copolymer (Byk-Chemie); modified polyethoxylated siloxanes, such as Edaplan LA 411, a modified polyethoxylated siloxane (Münzing); and polyether siloxane copolymers, such as Tegoglide 265 and Tegoglide 410 (Tego Chemie Service) are also useful as coating attack-suppressing agents. SURFYNOL® 440 (Air Products), an ethoxylated tetramethyldecin-4,5-diol; and Lubrimet P900 (BASF), a poly-propylene oxide are also useful coating attack-suppressing agents.

Processing

Imaging, as described below, produces an imaged precursor, which comprises a latent image of image regions and non-image regions in the imageable layer. Development of the imaged precursor to form a printing plate, or printing form, converts the latent image to an image by removing the non-image regions, revealing the hydrophilic surface of the underlying substrate.

Most positive-working and negative-working printing plate precursors comprise materials that are soluble or dispersible in aqueous base, such as phenolic polymers, carboxylic acid polymers, and/or sulfonamide polymers, in the imageable layer. Consequently, alkaline solutions are useful as developers. Developers used for positive-working precursors typically have a pH of more than 10, usually in the range of about 12 to about 14. Developers used for negative working precursors typically have a somewhat lower pH value, i.e. around 10. Development of both positive-working and negative-working imaged precursors is typically carried out at a temperature of from about 18° C. to about 28° C., for a period of from about 5 seconds to about 60 seconds.

Alkaline developers for developers for printing plate precursors are well known. Developers are described for example, in Yamasue, U.S. Pat. No. 4,259,434; Seino, U.S. Pat. No. 4,452,880; Miller, U.S. Pat. No. 5,851,735; Eckler, U.S. Pat. No. 5,998,102; Miro, EB-A-0 732 628; Toyama, GB-A-2,276,729 (DE-A-4 411 176); and Fiebag, U.S. Pat. No. 6,143,479.

The development process is typically carried out in a processor equipped with an immersion type-developing bath, a section for rinsing with water, a gumming section, a drying section, and a conductivity-measuring unit. Typically, the developer is applied to the imaged precursor by rubbing or wiping the imageable layer with an applicator containing the developer. Alternatively, the imaged precursor may be brushed with the developer or the developer may be applied to the precursor by spraying the imageable layer with sufficient force to remove the exposed regions. In either instance, a printing plate is produced. Development may be carried out in a commercially available processor, such as a Mercury Processor (Kodak Polychrome Graphics).

During the development process, some of the developer is removed from the developing bath with the developed printing plates (drag-out). In addition, some of the base in the developer is consumed as the developer becomes loaded with components of the imageable layer that have been removed during the development process. To achieve constant activity for the developer, a replenisher is periodically added to the developer bath so that a balance between developer drag-out and developer feed-in is reached.

Because there is a correlation between the electric conductivity and the alkalinity of the developer bath, the activity of the developer can be monitored by conductivity. After a certain number of imaged precursors have been processed, the conductivity value falls below a predetermined level. As soon as a reduction of electrical conductivity is detected, replenisher is added to the section of the processor that contains the developer until the electrical conductivity of the developer reaches its original value. Typically about 30 mL to about 100 mL, typically about 50–80 mL, of replenisher per 1 $m^2$ of imaged precursor processed is necessary to keep both the alkalinity of the developer and its conductivity value substantially constant.

Alternatively, the alkalinity of the developer can be measured by titration of a developer aliquot with an acid, such as hydrochloric acid. This is necessary for developers whose conductivity cannot be readily measured, such as developers that work with the top-up mode in which the developer is used to replace the alkalinity lost during the developer loading cycle. In these cases, the conductivity changes throughout the developer loading cycle. Such developers are described, for example, in Fiebag, U.S. Pat. No. 6,255,042; and Riley, EP-A-0 274 044.

The replenisher differs from the developer in that it has a higher concentration of the alkaline component or components than the developer to compensate for the base consumed in the development process. The concentration of other components is the same. Although the activity of the developer is maintained at its original value during the development process or developer loading cycle, the developer becomes more aggressive. That is, for precursors that have been exposed with equivalent amounts of radiation, the developer removes more of the imageable layer during the later stages of the developer loading cycle than during the early stages of the developer loading cycle.

While not being bound by any theory or explanation, the reason the developer becomes more aggressive may be due to a combination of several factors. For example, in sodium metasilicate based developers, it is believed that the developer becomes more aggressive due to the presence of sodium carbonate in loaded developer. During the developer loading cycle, carbon dioxide from the air is continuously dragged into the developer, forming sodium carbonate. Although the alkalinity decreases due to the reaction of base with carbon dioxide, the developer becomes more aggressive due the presence of the resulting carbonate salts. In addition, a part of the coating attack-suppressing agent in the developer may be absorbed by the precursor by, for example, complexing with the phenolic resin or other resins present in the photoimageable layer, and is removed from the developer bath with the precursor.

As described above, the developer comprises a coating attack-suppressing agent. To compensate for the increase in aggressiveness of the developer during the developer loading cycle and maintain constant results for the developed plates, the concentration of the coating attack-suppressing agent in the developer must be constantly readjusted upward during the developer loading cycle. That is, the increase in developer aggressiveness during the developer loading cycle can be counteracted by gradually increasing the concentration of coating attack-suppressing agent in the developer. This is accomplished by using a higher concentration of coating attack-suppressing agent in the replenisher than in the developer. Thus, as replenisher is added to the developer bath, the concentration of coating attack-suppressing agent in the developer bath gradually increases as more replenisher is added, counteracting the increase in aggressiveness in the developer. In addition, the added coating attack-suppressing agent replaces any coating attack-suppressing agent that may have been absorbed by the developed plates and removed from the bath with the developed plates.

Preferably, the concentration of coating attack-suppressing agent in the replenisher is that concentration that will keep the aggressiveness of the developer substantially constant during the developer loading cycle. As illustrated in the Examples, the amount of coating attack-suppressing agent necessary to counteract the increase in aggressiveness in the developer during the developer loading cycle can be determined. A "soak test" is carried out on exposed precursors using fresh developer, loaded developer, and loaded developer containing varying amounts of added coating attack-suppressing agent. The amount of additional coating attack-suppressing agent necessary is the amount required to decrease the aggressiveness of loaded developer to that of fresh developer.

Following development, the printing plate is rinsed with water and dried. Drying may be conveniently carried out by infrared radiators or with hot air. After drying, the printing plate may be treated with a gumming solution. A gumming solution comprises one or more water-soluble polymers, for example polyvinylalcohol, polymethacrylic acid, polymethacrylamide, polyhydroxyethylmethacrylate, polyvinylmethylether, gelatin, and polysaccharide such as dextran, pullulan, cellulose, gum arabic, and alginic acid. A preferred material is gum arabic. A developed and gummed plate may also be baked to increase the run length of the plate. Baking can be carried out, for example at about 220° C. to about 240° C. for about 7 to 10 minutes, or at a temperature of 120° C. for 30 min.

Printing Plate Precursors

Printing plate precursors are well known. The precursor comprises an imageable layer over a hydrophilic substrate. Other layers may also be present in the precursor.

The hydrophilic substrate, i.e., the substrate that comprises at least one hydrophilic surface, comprises a support, which may be any material conventionally used to prepare printing plate precursors. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof. Typically, the substrate comprises an interlayer between the aluminum support and the imageable layer. The interlayer may be formed by treatment of the support with, for example, silicate, dextrine, hexafluorosilicic acid, phosphate/fluoride, polyvinyl phosphonic acid (PVPA) or polyvinyl phosphonic acid copolymers.

The imageable layer comprises either a positive-working or a negative-working imageable composition. The composition may be sensitive to ultraviolet and/or visible radiation (i.e., photoimageable), and/or it may be thermally imageable.

Positive-working photoimageable compositions are well known. They are discussed, for example, in Chapter 5 of *Photoreactive Polymers: the Science and Technology of Resists,* A. Reiser, Wiley, New York, 1989, pp. 178–225. These compositions comprise a water insoluble, alkali soluble binder and a material that comprises a photosensitive moiety. The photosensitive moiety may be bonded to the binder and/or be present in a separate compound.

The binder may comprise a phenolic resin, such as a novolac resin. Novolac resins are prepared by reacting m-cresol, mixtures of m-cresol and p-cresol, or phenol with formaldehyde are particularly useful. Other phenolic resins include polyvinyl compounds having phenolic hydroxyl groups. Such compounds include, for example, resole resins, polymers of hydroxystyrene (vinyl phenol), such as poly(p-hydroxystyrene); copolymers containing recurring units of hydroxystyrene; and polymers and copolymers containing recurring units of substituted hydroxystyrenes, such as acrylate and methacrylate copolymers of hydroxystyrene. The binder may also be a water insoluble, base soluble polymeric compound having pendent sulfonamide groups, such as is described in Aoshima, U.S. Pat. No. 5,141,838 (EP 330, 239).

The photosensitive moiety is typically the o-diazonaphthoquinone moiety. Compounds that contain the o-diazonaphthoquinone moiety (i.e., quinonediazides), preferably compounds that comprise an o-diazonaphthoquinone moiety attached to a ballasting moiety that has a molecular weight of at least 1500, but less than about 5000, are preferred. Typically, these compounds are prepared by the reaction of a 1,2-naphthoquinone diazide having a halogenosulfonyl group, typically a sulfonylchloride group, at the 4- or 5-position with a mono- or poly-hydroxyphenyl compound, such as mono- or poly-hydroxy benzophenone.

The phenolic resin may be derivatized with an o-diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Suitable polymeric materials for forming these derivatized resins include the novolac resins, resole resins, polyvinyl phenols, acrylate and methacrylate copolymers of hydroxy-containing monomers such as hydroxystyrene. Representative reactive derivatives include sulfonic and carboxylic acid, ester, or amide derivatives of the diazonaphthoquinone moiety. Derivatization of phenolic resins with compounds that contain the diazonaphthoquinone moiety is well known in the art and is described, for example, in West, U.S. Pat. Nos. 5,705,308, and 5,705,322.

Positive-working thermally imageable layers comprise a binder, a dissolution suppressor, and optionally, a photothermal conversion material. Such systems are disclosed in, for example, Parsons, WO 97/39894; Nagasaka, EP 0 823 327; Miyake, EP 0 909 627; West, WO 98/42507; and Nguyen, WO 99/11458. The binder is typically a phenolic resin, such as a novolac resin.

The dissolution suppressor may be a compound that comprises an o-diazonaphthoquinone moiety, such as is discussed above. The derivatized resins that comprise an o-diazonaphthoquinone moiety can act as both the binder and the dissolution suppressor. They can be used alone, or they can be combined with other binders and/or dissolution suppressors. Other compounds useful as dissolution suppressors include, compounds that contain a positively charged (i.e., quaternized) nitrogen atom, for example, tetraalkyl ammonium compounds, quinolinium compounds, benzothiazolium compounds, pyridinium compounds, and imidazolium compounds. A preferred group of dissolution suppressor compounds includes those that are also dyes, especially triarylmethane dyes such as ethyl violet. These compounds can also act as contrast or coloration dyes, which distinguishes the unimaged regions from the imaged regions in the developed element.

Alternatively, or additionally, the binder itself can comprise polar groups that act as acceptor sites for hydrogen bonding with the hydroxy groups present in the polymeric material and, thus, act as a dissolution suppressor. Using well-known methods, a portion of the hydroxyl groups of the binder can be derivatized to introduce polar groups, for example carboxylic acid esters, such as benzoate esters; phosphate esters; ethers, such as phenyl ethers; and sulfonic acid esters, such as methyl sulfonates, phenyl sulfonates, p-toluene sulfonates (tosylates), and p-bromophenyl sulfonates (brosylates).

If the imageable element is to be imaged with infrared or near infrared radiation, the imageable layer absorbs the imaging radiation, preferably radiation in the range of about 800 nm to 1200 nm, the radiation is commonly used for imaging thermally imageable elements. An absorber called a photothermal conversion material, which absorb radiation and convert it to heat, is typically present in the imageable layer. Photothermal conversion materials may absorb ultraviolet, visible, and/or infrared radiation and convert it to heat. Although the binder may itself comprise an absorbing moiety, i.e., be a photothermal conversion material, typically the photothermal conversion material is a separate compound. The photothermal conversion material may be either a dye or pigment, such as carbon black, a dye or pigment of the squarylium, cyanine, merocyanine, indolizine, pyrylium, or metal diothiolene class. Dyes to aid in the visual inspection of the exposed and/or developed element may also be present.

Negative-working, alkaline developable printing plates are described, for example, in Haley, U.S. Pat. No. 5,372,907; Haley U.S. Pat. No. 5,466,557; and Nguyen, U.S. Pat. No. 5,919,601.

Imaging

Imaging may be carried out by well-known methods. If the precursor is photoimageable, it may be exposed to actinic radiation from a source of radiation that is absorbed by the photoreactive component or components present. Conventional exposure sources include, for example, carbon arc lamps, mercury lamps, xenon lamps, tungsten lamps, metal halide lamps, and lasers emitting at the appropriate wavelength. Diazonaphthoquinone compounds substituted in the 5-position typically absorb at 345 nm and 400 nm. Diazonaphthoquinone compounds substituted in the 4-position typically absorb at 310 nm and 380 nm. Imagewise exposure is typically carried out through a photomask, but direct digital exposure with a laser emitting at the appropriate wavelength is also possible.

If the precursor is thermally imageable, it may be imaged with a laser or an array of lasers emitting modulated near infrared or infrared radiation in a wavelength region that is absorbed by the precursor. Infrared radiation, especially infrared radiation in the range of about 800 nm to about 1200 nm, is typically used for imaging thermally imageable precursors. Imaging is conveniently carried out with a laser emitting at about 830 nm or at about 1056 nm. Suitable commercially available imaging devices include image setters such as a Creo Trendsetter (CREO, British Columbia, Canada) and a Gerber Crescent 42T (Gerber).

Alternatively, thermally imageable precursors may be imaged using a conventional apparatus containing a thermal printing head. An imaging apparatus suitable for use in conjunction with the imageable elements includes at least one thermal head but would usually include a thermal head array, such as a TDK Model No. LV5416 used in thermal fax machines and sublimation printers. When exposure is carried out with a thermal head, it is unnecessary that the precursor absorb infrared radiation. However, precursors that absorb infrared radiation can be imaged with a thermal head. After imaging, the element is processed as described above.

INDUSTRIAL APPLICABILITY

The method of the invention can be used to develop exposed printing plate precursors in which the imageable layer comprises at least one material that is insoluble in water and removable by an aqueous alkaline developer, such as a phenolic polymer, a carboxylic acid polymer, and/or a sulfonamide polymer. It can be used with both positive-working and negative-working printing plate precursors. Because the aggressiveness of the developer remains substantially constant during the developer loading cycle, consistent results are obtained throughout the cycle.

The advantageous properties of this invention can be observed by reference to the following examples, which illustrate but do not limit the invention. In the specification, examples, and claims, unless indicated otherwise, all percentages are percentages by weight, based on the weight of the developer.

EXAMPLES

| Glossary | |
|---|---|
| PLURIOL ® P600 | Polypropyleneglycol ether (BASF, Ludwigshafen, Germany) |
| REWOTERIC ® AM-V | Sodium capryloamphoacetate wetting agent (Witco, Perth Amboy, NJ, USA) |
| SYNPERONIC ® T 304 | Poloxamine 304; Polyoxyethylene, polyoxypropylene liquid block copolymer of ethylene diamine (I.C.I. Am., Wilmington, DE, USA) |
| TRILON ® B chelating agent | Tetra sodium ethylenediamine tetraacetic acid (BASF, Ludwigshafen, Germany) |

Developers and Replenishers

Developer 1—A developer for positive-working thermal printing plate precursors was prepared by stirring together the following: water (75.48 wt %); SYNPERONIC® T 304 (0.22 wt %); 45 wt % potassium hydroxide solution (10.72 wt %); 85% phosphoric acid (2.08 wt %); waterglass 42/42 Grad Be (5.85 wt %); REWOTERIC® AM-V (0.18 wt %); sodium cumol sulfonate (5.29 wt %); and TRILON® B chelating agent (0.18%).

Developer 2—A developer negative-working thermal printing plate precursors was prepared by stirring together the following: water (60.00 wt %); 30% potassium silicate solution (20.90%); 45% potassium hydroxide solution (10.00 wt %); 85% phosphoric acid (0.10 wt %); glycerin (9.00%); and PLURIOL® P600 (0.02).

Replenisher 1—A replenisher was prepared by stirring together the following: water (68.26 wt %); SYNPERONIC® T 304 (0.44 wt %); 45 wt % potassium hydroxide solution (17.72 wt %); 85% phosphoric acid (2.08 wt %); waterglass 42/42 Grad Be (5.85 wt %); REWOTERIC® AM-V (0.18 wt %); sodium cumol sulfonate (5.29 wt %); and TRILON® B chelating agent (0.18%).

Replenisher 2 (comparative replenisher)—A replenisher was prepared by stirring together the following: water (68.48 wt %); SYNPERONIC® T 304 (0.22 wt %); 45 wt % potassium hydroxide solution (17.72 wt %); 85% phosphoric acid (2.08 wt %); waterglass 42/42 Grad Be (5.85 wt %); REWOTERIC® AM-V (0.18 wt %); sodium cumol sulfonate (5.29 wt %); and TRILON® B chelating agent (0.18%).

Replenisher 3—A replenisher was prepared by stirring together the following: water (56.88 wt %); 30% potassium silicate solution (23.00%); 45% potassium hydroxide solution (11.00 wt %); 85% phosphoric acid (0.10 wt %); glycerin (9.00%); and PLURIOL® P600 (0.02).

Replenisher 4—A replenisher was prepared by stirring together the following: water (56.80 wt %); 30% potassium silicate solution (23.00%); 45% potassium hydroxide solution (11.00 wt %); 85% phosphoric acid (0.10 wt %); glycerin (9.00%); and PLURIOL® P600 (0.10).

Standard Procedures

Soak Test—The resistance of the developed image to attack by developer was tested at regular intervals by the soak test. Elongated drops of developer were placed on a 7 cm×30 cm strip of developed printing plate at 30 sec intervals over a 5 min period. The plate was then rinsed and the time at which the coating was free from developer attack was noted.

Drop Test—The speed of development was determined by the drop test. Elongated drops of developer were placed on a 7 cm×30 cm strip of undeveloped printing plate at 5 sec intervals over a 30 sec period. The plate was then rinsed and the time at which the coating developed clean was noted. A drop test within 10 sec is considered to be a good development speed.

Example 1

This example illustrates the use of the developer and replenisher with positive-working thermal lithographic printing plate precursors without added coating attack-suppressing agent.

Exposure—ELECTRA® EXCEL positive-working thermal printing plate precursors (Kodak Polychrome Graphics LLC) (790 mm×1030 mm) were exposed with a Creo 3244 Trendsetter (CREO, British Columbia, Canada) infrared exposure unit at an energy of 10 W and a drum rotational speed 180 rpm. The Kodak Professional COLORFLOW® Strip (Eastman Kodak), which contains different elements for evaluating the quality of the copies, was used for evaluation.

Processing—A commercially available processor (Mercury CTP; Kodak Polychrome Graphics LLC), equipped with an immersion-type developing bath, a section for rinsing with water, a gumming section, and a drying section, was used to develop the exposed plate precursors. The processor was filled with 45 L of developer. A separate container for the replenisher was attached from which a calculated amount of replenisher per square meter of exposed plate precursor was added to the developing bath via a pump to maintain the conductivity at a constant level.

About 100 exposed plate precursors per day were processed over an 8 day period (equal to 81.37 m$^2$ of exposed plate precursors per day). During this period, the temperature of the developing bath, (21±1)° C., and dwell time in the developer, 40 sec, were held constant in all tests. Replenisher was added at a rate of 42 mL/plate precursor (45 g of replenisher per $m^2$ of exposed plate precursor). Conductivity, measured with a Siemans Sipan 3, was maintained at 71±1 ms/c. Developer alkalinity, measured by titrating 10 mL of developer with 0.5 N hydrochloric acid was within the range of 5.7±0.3 mL. The gum used was 850S (Kodak Polychrome Graphics LLC).

Results—The results from processing exposed positive-working thermal printing plate precursors using Developer 1 and Replenisher 2 (control replenisher) are shown in Table 1.

TABLE 1

|  | Soak Test | Drop Test | Conductivity | Titration[a] |
| --- | --- | --- | --- | --- |
| Fresh Developer | 5 min | 10 sec | 70.9 ms/cm | 8.8 mL |
| Day 2 | 5 min | 10 sec | 70.1 ms/cm | 8.5 mL |
| Day 4 | 4 min | 5 sec | 70.5 ms/cm | 8.7 mL |
| Day 6 | 3 min | 5 sec | 71.0 ms/cm | 8.8 mL |
| Day 8 | 2 min | 5 sec | 70.7 ms/cm | 8.7 mL |

[a]10 mL of replenisher titrated with 0.5 N hydrochloric acid.

When Replenisher 2 was used with Developer 1, the conductivity and alkalinity remained relatively constant over the 8 day period. However, as shown by the soak test and the drop test, the developer became increasingly aggressive during this period.

Example 2

This example illustrates an extreme case of the effect of sodium carbonate in the developer on the soak test on positive-working thermal lithographic printing plate precursors using fresh developer. Carbonate salts are formed in the developer through drag in of carbon dioxide from the air during the developer loading cycle, which can run over many days. As the concentration of sodium carbonate increases, the developer becomes more aggressive.

During the developer loading cycle, which runs over a period of many days, carbon dioxide from the air is continuously dragged into the developer, forming sodium carbonate. The developer becomes more aggressive as the concentration of sodium carbonate increases. Carbon dioxide drag-in is one of the reasons that the developer becomes more aggressive with increasing loading under constant alkalinity and conductivity.

The soak test was carried out with fresh developer and with fresh developer to which varying amounts of sodium carbonate had been added. The results are shown in Table 2.

TABLE 2

|  | Soak Test |
| --- | --- |
| Fresh Developer | 5 min |
| Fresh Developer + 1% sodium carbonate | 2 min |
| Fresh Developer + 2.5% sodium carbonate | 1 min |
| Fresh Developer + 5% sodium carbonate | <1 min |

Example 3

This example illustrates the use of the developer and replenisher with positive-working thermal lithographic printing plate precursors with added coating attack-suppressing agent.

To compensate for the increased aggressiveness of the developer, additional coating attack-suppressing agent can be introduced into the developer through the replenisher. During the 8-day period, a total of 650 $m^2$ of exposed plate precursors were developed with the addition of 29.25 kg of replenisher (45 $g/m^2$). SYNPERONIC® T 304 was added in increments to loaded developer. The drop and soak tests were carried out after each addition.

Results—The results are shown in Table 3.

TABLE 3

| SYNPERONIC ® T 304 Added[a] | Soak Test | Drop Test |
| --- | --- | --- |
| 0 g | 2.5 min | 5 sec |
| 20 g | 3.5 min | 5 sec |
| 35 g | 4 min | 10 sec |
| 50 g | 4.5 min | 10 sec |
| 65 g | 5 min | 10 sec |

[a]Amount added to Developer 1 loaded with 650 $m^2$ of exposed plate precursors.

This indicates that 65 g of SYNPERONIC® T 304 is needed to bring the soak test back to 5 min. This amount was added to 29.25 kg of replenisher to give a concentration of 0.44 wt % SYNPERONIC® T 304 in Replenisher 1.

The results from processing exposed positive-working thermal printing plate precursors using Developer 1 and Replenisher 1 are shown in Table 4.

TABLE 4

|  | Soak Test | Drop Test | Conductivity | Titration[a] |
| --- | --- | --- | --- | --- |
| Fresh Developer | 5 min | 10 sec | 70.9 ms/cm | 8.8 mL |
| Day 2 | 4.5 min | 10 sec | 70.8 ms/cm | 8.7 mL |
| Day 4 | 4.5 min | 10 sec | 70.5 ms/cm | 8.5 mL |
| Day 6 | 4.5 min | 10 sec | 71.0 ms/cm | 8.8 mL |
| Day 8 | 4.5 min | 10 sec | 70.7 ms/cm | 8.7 mL |

[a]10 mL of replenisher titrated with 0.5 N hydrochloric acid.

Although the image areas were increasingly attacked when Replenisher 2 was used with Developer 1, the results when Replenisher 1 was used with Developer 1 remained good throughout the entire developer loading cycle. With Replenisher 1, the optical densities were unchanged in the solid areas and the 1 and 2 pixel elements, the 1% highlight and shadow areas showed good resolution with both fresh and loaded developer. Plate precursors processed in the developer after it had been used for 8 days did not show any irregularities in the printing test. Plate precursors of varying age showed constant results compared with those developed with Developer 1 and Replenisher 2.

Example 4

This example illustrates the use of the developer and replenisher with negative-working thermal lithographic printing plate precursors.

Exposure—DITP negative-working preheat thermal printing plate precursors (Kodak Polychrome Graphics LLC) (790 mm×1030 mm) were exposed with a range of exposure energies from 100 to 180 $mJ/cm^2$ with a Creo 3244 Trendsetter infrared exposure unit at an energy of 9 W and a varying drum rotational speed to give strips of 100% solid areas at various exposure energies.

Processing—The exposed plate precursors were preheated by passing through a Techno-Grafica Preheat oven set at 144° C. at a speed of 90 cm/min. The plate precursors were developed in a Mercury CTP processor filled with 45

L of Developer 2. The developer was replenished with Replenisher 3 at a rate of 32 mL/plate precursor (35 g of replenisher per plate precursor). The density reading of the imaged solid areas of the developed plate was measured using a Gretag D19C densitometer with a cyan filter.

The developer was fed with exposed plates to load the developer up to 8 m² of exposed plate precursor per liter of developer (110 plates/day over 4 days), while the conductivity and alkalinity of the developer were held constant. During this process 19.8 kg of replenisher was used.

At the end of this period, the image density for another imaged plate precursor, imaged as described above, was measured using the Gretag D19C densitometer with a cyan filter. Varying amounts of PLURIOL® P600 were added to the used developer, and the process repeated. Reduced optical density values observed with used developer, indicating that the used developer was more aggressive than the fresh developer. However, the optical density values with fresh developer were observed when 15 g of PLURIOL® P600 was added to 45 mL of used developer.

A soak test was carried out on an imaged plate precursor that had been imaged and preheated as described above. The plate was exposed to the developer for a period of time, rinsed, and the optical density determined. Reduced optical density values were observed with used developer, indicating that the used developer was more aggressive than the fresh developer. However, the optical density values observed with fresh developer were observed when 15 g of PLURIOL® P600 was added to 45 mL of used developer.

Example 5

This example illustrates the use of the developer and replenisher to which additional coating attack-suppressing agent had been added with negative-working thermal lithographic printing plate precursors.

From the amount of replenisher used in Example 3 (19.8 kg) and the amount of coating attack-suppressing agent required to bring the optical density reading with used developer back to those observed with fresh developer, it was calculated that a PLURIOL® P600 concentration of 0.1 wt % was required in the replenisher.

The exposure and developing process of Example 3 was repeated using Replenisher 4, which comprised 0.1 wt % PLURIOL® P600, with a replenishing rate of 32 mL of replenisher per imaged plate precursor processed. At intervals of loading of 2 m²/L of processed imaged plate precursor, digitally imaged plate precursors, imaged both by exposure with varying amounts of thermal energy and with the UGRA digital scale for evaluation of highlights and shadows, were preheated and developed as described above. The soak and the drop test were also carried out.

The measured optical density readings for the digitally imaged plate precursors showed no significant change in density and tonal value during the developer loading cycle. The soak test and drop test results were constant throughout the developer loading cycle.

Having described the invention, we now claim the following and their equivalents.

What is claimed is:

1. A method for developing an exposed lithographic printing plate precursor using a developer and replenisher, the method comprises the steps of:
   a) developing the exposed printing plate precursor with the developer; and
   b) adding the replenisher to the developer so that the activity of the developer remains relatively constant;

wherein:
   the printing plate precursor comprises an imageable layer:
      the imageable layer comprises a material that is soluble or dispersible in aqueous alkaline solution;
      the developer comprises an alkaline material and a developer-soluble coating attack-suppressing agent;
      the replenisher comprises the alkaline material and the coating attack-suppressing agent;
      the alkaline material in the replenisher is at a higher concentration than the alkaline material in the developer;
      the coating attack-suppressing agent in the replenisher is at a higher concentration than the coating attack-suppressing agent in the developer; and
      the concentration of coating attack-suppressing agent in the replenisher is that concentration that will keep the aggressiveness of the developer substantially constant during the developer loading cycle.

2. The method of claim 1 in which the coating attack-suppressing agent is a polyethyoxylated, polypropoxylated, or polybutyloxylated compound.

3. The method of claim 1 in which the coating attack-suppressing agent comprises at least one polyoxyethylene block and at least one polyoxypropylene block.

4. The method of claim 1 in which the coating attack-suppressing agent is a developer-soluble compound selected from the group consisting of:
   (1) compounds of the structure:

$$R^1O(CH_2-CHR^2-O)_n-R^3$$

in which n is an integer; $R^1$ is hydrogen, $C_1-C_{18}$ alkyl, $C_1-C_{18}$ aryl, $C_1-C_{18}$ substituted aryl, or $C_1-C_{18}$ aralkyl; $R^2$ is hydrogen, methyl, or ethyl; $R^3$ is hydrogen, $C_1-C_8$ alkyl, —$CH_2COOH$, or $CH_2COO^- M^+$, in which M is ammonium, substituted ammonium, sodium or potassium; and
   (2) polycondensation products of at least one $C_2-C_4$ alkylene oxide and ethylene diamine.

5. The method of claim 4 in which the material that is soluble or dispersible in aqueous alkaline solution is a phenolic polymer, a carboxylic acid polymer, a sulfonamide polymer, or a mixture thereof.

6. The method of claim 5 in which the material that is soluble or dispersible in aqueous alkaline solution is a novolac resin.

7. The method of claim 1 in which the coating attack-suppressing agent is a polyethylene oxide, a polypropylene oxide, or a block or random copolymer of ethylene oxide and propylene oxide.

8. The method of claim 1 in which the coating attack-suppressing agent is an polyoxyethylene/polyoxypropylene/polyoxyethylene A-B-A block copolymer.

9. The method of claim 1 in which the coating attack-suppressing agent is a polycondensation product of at least one least one $C_2-C_4$ alkylene oxide with ethylene diamine.

10. The method of claim 1 in which the coating attack-suppressing agent is a poloxamine.

11. The method of claim 1 in which the material that is soluble or dispersible in aqueous alkaline solution is a phenolic polymer, a carboxylic acid polymer, a sulfonamide polymer, or a mixture thereof.

12. The method of claim 11 in which the imageable layer additionally comprises a dissolution suppressor.

13. The method of claim 11 in which the material that is soluble or dispersible in aqueous alkaline solution is a novolac resin.

14. The method of claim 13 in which the imageable layer additionally comprises a compound that comprises the o-diazonaphthoquinone moiety.

15. The method of claim 14 in which the coating attack-suppressing agent is an polyoxyethylene/polyoxypropylene/polyoxyethylene A-B-A block copolymer or a poloxamine.

16. The method of claim 13 in which the imageable layer additionally comprises a dissolution suppressor.

17. The method of claim 16 in which the coating attack-suppressing agent is an polyoxyethylene/polyoxypropylene/polyoxyethylene A-B-A block copolymer or a poloxamine.

18. The method of claim 1 in which the coating attack-suppressing agent is a quaternary ammonium chloride.

19. The method of claim 1 in which the method additionally comprises the step of monitoring the conductivity of the developer.

20. The method of claim 19 in which the material that is soluble or dispersible in aqueous alkaline solution is a phenolic polymer, a carboxylic acid polymer, a sulfonamide polymer, or a mixture thereof; and the coating attack-suppressing agent is an polyoxyethylene/polyoxypropylene/polyoxyethylene A-B-A block copolymer or a poloxamine.

21. The method of claim 20 in which the material that is soluble or dispersible in aqueous alkaline solution is a novolac resin and the imageable layer additionally comprises a compound that comprises the o-diazonaphthoquinone moiety.

22. The method of claim 1 in which the developer comprises sodium metasilicate.

23. The method of claim 1 in which the developer comprises potassium hydroxide.

24. The method of claim 19 in which the material that is soluble or dispersible in aqueous alkaline solution is a phenolic polymer, a carboxylic acid polymer, a sulfonamide polymer, or a mixture thereof.

25. The method of claim 24 in which the coating attack-suppressing agent is a quaternary ammonium chloride.

26. The method of claim 24 in which the coating attack-suppressing agent is a polyethyoxylated or a polypropoxylated compound.

27. The method of claim 26 in which the material that is soluble or dispersible in aqueous alkaline solution is a novolac resin and the imageable layer additionally comprises a compound that comprises the o-diazonaphthoquinone moiety.

28. The method of claim 1 additionally comprising, before step a), the step of determining the concentration of the coating attack suppressing agent that will keep the aggressiveness of the developer substantially constant during the developer loading cycle.

* * * * *